US008350542B2

(12) United States Patent  (10) Patent No.: US 8,350,542 B2
Armaroli et al.  (45) Date of Patent: Jan. 8, 2013

(54) STEPWISE RAMP VOLTAGE GENERATOR

(75) Inventors: Diego Armaroli, Mortara (IT); Davide Betta, Barzanò (IT); Marco Ferrari, Voghera (IT); Roberto Trabattoni, Oggiona con Santo Stefano (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 387 days.

(21) Appl. No.: 12/490,961

(22) Filed: Jun. 24, 2009

(65) Prior Publication Data

US 2010/0001707 A1 Jan. 7, 2010

(30) Foreign Application Priority Data

Jul. 1, 2008 (IT) .................................. VA08A0039

(51) Int. Cl.
 *G05F 1/00* (2006.01)
(52) U.S. Cl. ........ 323/242; 323/311; 323/313; 323/325; 323/326
(58) Field of Classification Search .................. 323/238, 323/242, 288, 313, 315, 326, 311; 327/539
See application file for complete search history.

(56) References Cited

U.S. PATENT DOCUMENTS

| | | | | |
|---|---|---|---|---|
| 4,078,252 A | | 3/1978 | Schoenfeld et al. ........... 364/858 |
| 4,675,546 A | * | 6/1987 | Shaw ............................. 327/176 |
| 4,812,687 A | * | 3/1989 | Larson et al. .................. 327/263 |
| 5,130,582 A | * | 7/1992 | Ishihara et al. ................ 327/262 |
| 5,283,476 A | | 2/1994 | Wakabayashi ................ 307/227 |
| 5,917,313 A | | 6/1999 | Callahan, Jr. .................. 323/288 |
| 6,094,077 A | * | 7/2000 | Nelson ........................... 327/131 |
| 6,316,926 B1 | | 11/2001 | Savo et al. .................... 323/282 |
| 2006/0267665 A1 | | 11/2006 | Kawamoto .................... 327/427 |
| 2009/0251178 A1 | * | 10/2009 | Choi et al. ..................... 327/131 |

FOREIGN PATENT DOCUMENTS

EP  0 562 452 A1  9/1993

OTHER PUBLICATIONS

Po-Hui Yang et al., "Low-Voltage Pulsewidth Control Loops for SOC Applications," IEEE Journal of Solid-State Circuits, vol. 37, No. 10, Oct. 1, 2002, pp. 1348-1351.
Lee, Cheung Fai et al., "A Monolithic Current-Mode CMOS DC-DC Converter With On-Chip Current-Sensing Technique," IEEE Journal of Solid-State Circuits, vol. 39, No. 1, Jan. 1, 2004, pp. 3-14.

* cited by examiner

*Primary Examiner* — Nguyen Tran
(74) *Attorney, Agent, or Firm* — Allen, Dyer, Doppelt, Milbrath & Gilchrist, P.A.

(57) ABSTRACT

A stepwise voltage ramp generator includes a tank capacitor, a terminal of which is coupled to a reference potential to be charged with a voltage ramp. A transistor couples the tank capacitor to a supply line. A diode-connected transistor, biased with a bias current is coupled to the transistor to form a current mirror. A by-pass switch is electrically coupled in parallel to the diode-connected transistor, and is controlled by a PWM timing signal, the duty-cycle of which determines a mean slope of the generated voltage ramp.

22 Claims, 3 Drawing Sheets

STEPWISE RAMP VOLTAGE GENERATOR

FIELD OF THE INVENTION

This invention relates in general to DC-DC voltage converters, and more particularly, to a soft-start circuit for a converter that generates a voltage ramp with a certain slope.

BACKGROUND OF THE INVENTION

A typical DC-DC converter is depicted in FIG. 1. When it is turned on, the output voltage VOUT on the hold capacitor Cout is practically null. The generator of PWM driving signals (PWM GENERATOR) of the half-bridge stage keeps the high-side transistor of the half-bridge saturated until an error signal VERROR, that is essentially a low-pass filtered replica of the difference between a reference voltage VREF and a scaled replica of the output voltage VOUT, decreases.

A tank capacitor Cout is charged through an inductance Lout, that is initially discharged, thus an uncontrolled overshoot of the current through the inductor Lout and a consequent uncontrolled overshoot of the output voltage VOUT with respect to the pre-established regulation value, determined by the voltage VREF, is generated.

The first effect may cause a breach of the specifications of maximum value of the current that can be absorbed from the line VIN or of the power consumption in the high-side of the half-bridge. The second effect may damage the circuits supplied by the regulator.

In order to address this, DC-DC regulators may include a so-called "soft-start" circuit, illustrated in FIG. 1, that drives the voltage VERROR with a pre-established voltage ramp. An exemplary embodiment of the soft-start circuit of FIG. 1 is depicted in FIG. 2. A voltage ramp generated by the generator RAMP GENERATOR is supplied to a clamp operational amplifier that makes the error voltage VERROR increase gradually. The duty-cycle of the PWM driving signal of the high-side transistor is gradually increased and thus overshoots of the current through the inductor Lout and of the voltage on the capacitor Cout may be limited.

The slope of the ramp is established as a function of the characteristics of the regulator and of the desired maximum current during the soft-start phase. Typically, the voltage ramp is generated by injecting a constant current through the tank capacitor. The slope is generally of about 1V/ms and this may be hard to obtain with a fully integrated architecture.

For example, U.S. Pat. No. 5,917,313 discloses a stepwise voltage ramp generator based on a switched capacitor circuit. U.S. Pat. No. 6,316,926 discloses a digital soft-start circuit for a DC-DC converter.

Other voltage ramp generators may, however, be desirable.

SUMMARY OF THE INVENTION

A stepwise voltage ramp generator having a simple architecture, fully integrable on a small silicon area, has now been found by the applicant.

The generator comprises a storage capacitor on which the voltage ramp is produced, and coupled to a supply line through a transistor connected to a diode-connected transistor biased with a certain current to form a current mirror. A by-pass switch driven by an externally generated PWM timing signal is electrically in parallel with the diode-connected transistor of the current mirror.

When the by-pass switch is open, the bias current through the diode is mirrored and injected through the tank capacitor, that is charged. When the by-pass switch is closed, the current mirror is by-passed and the voltage on the tank capacitor remains substantially constant. In this way, the mean slope of the voltage ramp that is produced may be determined by adjusting the duty-cycle of an externally generated PWM timing signal.

DETAILED DESCRIPTION OF THE PREFERRED EMBODIMENTS

Figure 1:
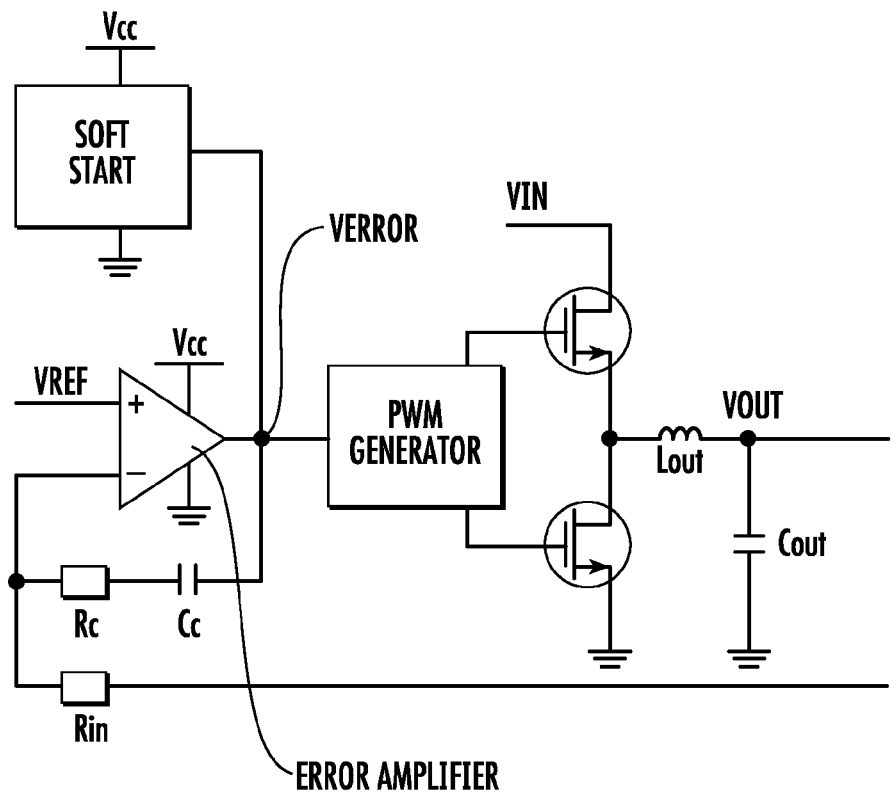
FIG. 1 depicts a typical architecture of a DC-DC converter, according to the prior art.
Figure 2:
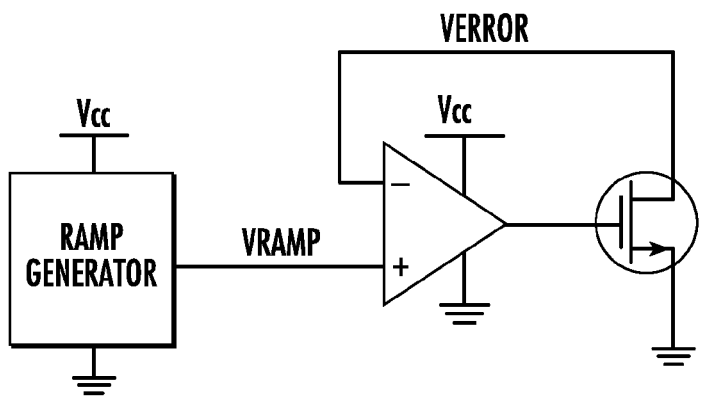
FIG. 2 depicts a typical "soft-start" circuit comprising a voltage ramp generator connected to a clamp circuit, according to the prior art.
Figure 3:
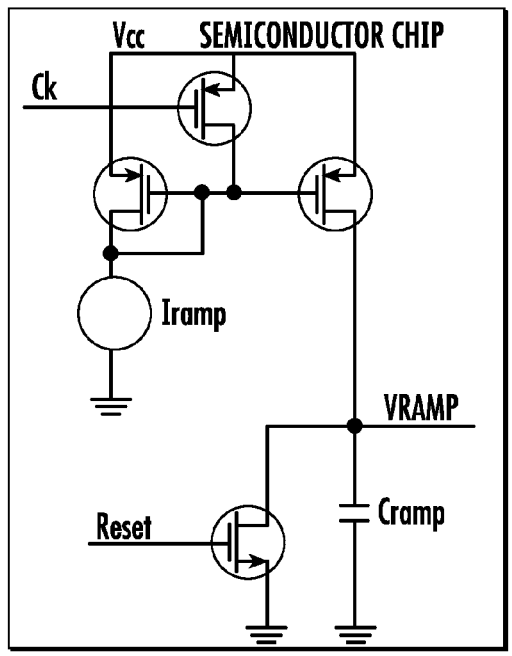
FIG. 3 illustrates an exemplary embodiment of a stepwise voltage ramp generator, according to the present invention.

An exemplary embodiment of the voltage ramp generator of this disclosure is depicted in FIG. 3. The tank capacitor Cramp is coupled to a supply line through a transistor that mirrors the current flowing through a diode-connected transistor. A by-pass switch is electrically coupled in parallel to the input transistor of the current mirror, thus the latter may be shorted or not depending on the logic state of a PWM timing signal Ck.

When the by-pass switch is off, the circuit mirrors a bias current Iramp through the tank capacitor Cramp. When the by-pass switch is on, current may not flow through the current mirror and a charge current may not be injected in the tank capacitor Cramp.

Figure 4:
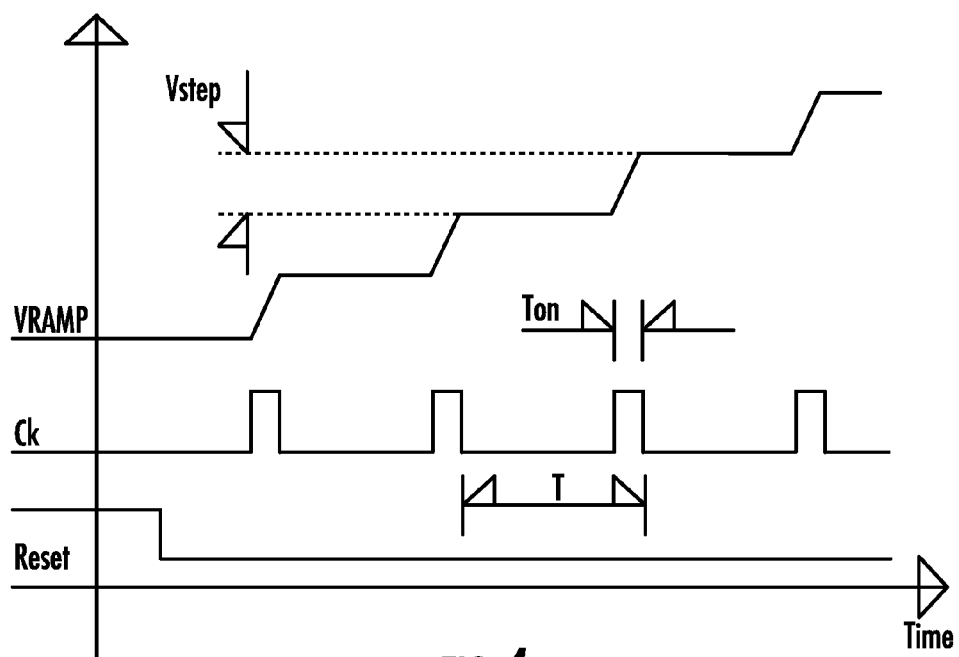
FIG. 4 is a time graph of the main signals of the generator of FIG. 3.

The graph of FIG. 4, of the main signals of the generator of FIG. 3, illustrates how the generator of this disclosure operates. The amplitude of the voltage steps Vstep depends on the capacitance Cramp, on the current n*Iramp delivered by the current mirror, wherein n is the mirror ratio, and on the duration Ton of the turn off intervals of the by-pass switch according to the following formula:

$$Vstep = \frac{n \cdot Iramp}{Cramp} \cdot Ton$$

The mean slope of the voltage ramp is given by the ratio between the amplitude Vstep and the duration of a switching period T:

$$Slew\_rate = \frac{Vstep}{T} = \frac{n \cdot Iramp}{Cramp} \cdot \frac{Ton}{T} = \frac{n \cdot Iramp}{Cramp} \cdot Duty\_cycle$$

thus it can be adjusted by adjusting the duty-cycle of the signal Ck.

The generator may not need a digital-to-analog converter, and can be realized using a current mirror, a capacitor and a transistor. The generator of this disclosure has the versatility of a digital architecture and the ability of implementing even tiny voltage steps without using complex hardware, such as a high resolution DAC.

Optionally, the generator may be equipped with a discharge transistor of the tank capacitor, depicted in FIG. 3, for discharging the capacitor before generating a new voltage ramp.

Figure 5:
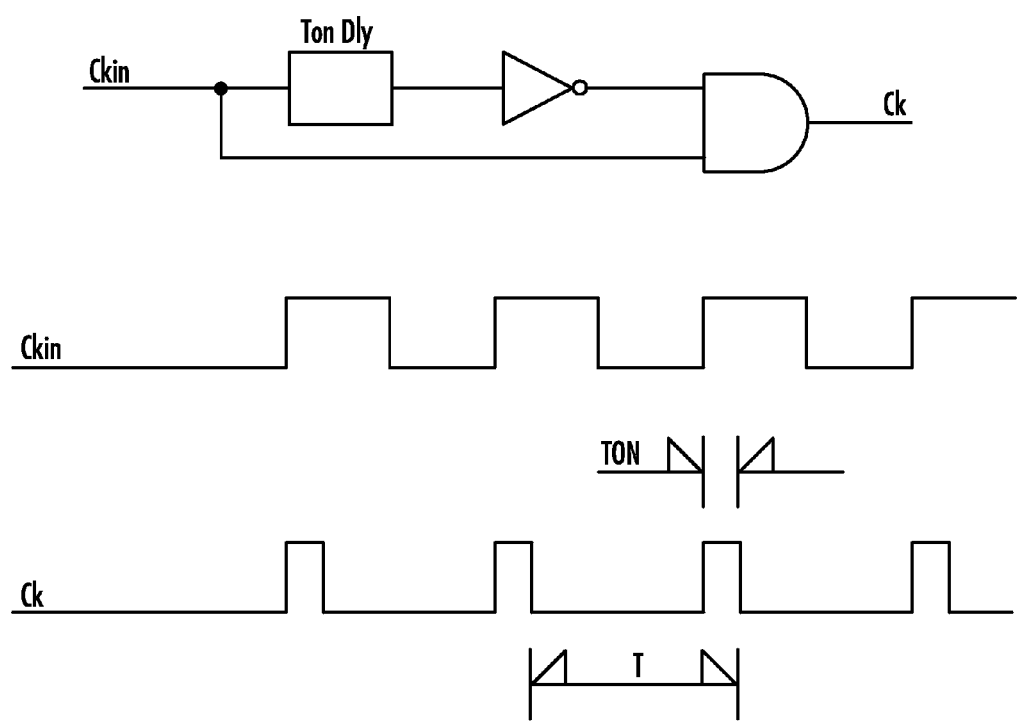
FIG. 5 depicts a digital circuit with an adjustable delay for generating a PWM signal with a certain duty-cycle using a PWM signal with a duty-cycle of 50%, according to the present invention.

An exemplary logic circuit for generating a PWM timing signal Ck with a duty-cycle of 50% is depicted in FIG. 5. The logic circuit comprises a NOT logic gate, and an AND logic gate and of an adjustable delay block that determines the duration Ton of the active phase of the signal Ck.

The generator of this disclosure can be realized either in MOS or BJT technology. In the exemplary embodiment of FIG. 3, the current mirror comprises N-channel MOSFETs, but it is possible to use P-channel MOSFETs, inverting the sign of the supply voltage Vcc and the polarity of the signal Ck.

That which is claimed is:

1. A stepwise voltage ramp generator comprising:
   a capacitor;
   at least one transistor to couple said capacitor to a supply line;
   a diode-connected transistor configured to be biased with a bias current and coupled to said at least one transistor to thereby form a current mirror;
   a bypass switch coupled in parallel to said diode-connected transistor and configured to be controlled by a pulse width modulation (PWM) timing signal; and
   a logic circuit and an adjustable delay circuit coupled thereto for generating the PWM timing signal from a system clock signal so that a voltage ramp comprises a plurality of voltage steps is generated on said capacitor, and wherein each voltage step has a voltage increase during a clock pulse and a constant voltage until a next clock pulse.

2. The stepwise voltage ramp generator of claim 1, wherein a slope of the voltage ramp on said capacitor comprises a mean slope.

3. The stepwise voltage ramp generator of claim 1, further comprising a discharge switch coupled in parallel with said capacitor and configured to be controlled by a discharge signal.

4. The stepwise voltage ramp generator of claim 1, wherein said capacitor, said supply line, said at least one transistor, said diode-connected transistor, and said bypass switch are integrated on a semiconductor chip.

5. The stepwise voltage ramp generator of claim 4, wherein said diode-controlled transistor and said at least one transistor comprise N-channel MOSFETs.

6. The stepwise voltage ramp generator of claim 4, wherein said diode-controlled transistor and said at least one transistor comprise P-channel MOSFETs.

7. The stepwise voltage ramp generator of claim 4, wherein said logic circuit and said adjustable delay circuit are also integrated on the semiconductor chip.

8. A stepwise voltage ramp generator integrated on a semiconductor chip and comprising:
   a capacitor;
   at least one transistor to couple said capacitor to a supply line;
   a diode-connected transistor configured to be biased with a bias current and coupled to said at least one transistor to thereby form a current mirror;
   a bypass switch coupled in parallel to said diode-connected transistor and configured to be controlled by a pulse width modulation (PWM) timing signal;
   a logic circuit and an adjustable delay circuit coupled thereto for generating the PWM timing signal from a system clock signal so that a voltage ramp comprises a plurality of voltage steps is generated on said capacitor, and wherein each voltage step has a voltage increase during a clock pulse and a constant voltage until a next clock pulse; and
   a discharge switch coupled in parallel with said capacitor and configured to be controlled by a discharge signal.

9. The stepwise voltage ramp generator of claim 8, wherein said discharge switch is coupled in parallel with said capacitor and is configured to be controlled by the discharge signal.

10. The stepwise voltage ramp generator of claim 8, wherein said diode-connected transistor and said at least one transistor comprise N-channel MOSFETs.

11. The stepwise voltage ramp generator of claim 8, wherein said diode-connected transistor and said at least one transistor comprise P-channel MOSFETs.

12. A DC-DC converter comprising:
   a soft-start circuit comprising a stepwise voltage ramp generator;
   said stepwise voltage ramp generator comprising
      a capacitor,
      at least one transistor to couple said capacitor to a supply line,
      a diode-connected transistor configured to be biased with a bias current and coupled to said at least one transistor to thereby form a current mirror,
      a bypass switch coupled in parallel to said diode-connected transistor and configured to be controlled by a pulse width modulation (PWM) timing signal, and
      a logic circuit and an adjustable delay circuit coupled thereto for generating the PWM timing signal from a system clock signal so that a voltage ramp comprises a plurality of voltage steps is generated on said capacitor, and wherein each voltage step has a voltage increase during a clock pulse and a constant voltage until a next clock pulse.

13. The DC-DC converter of claim 12, wherein a slope of the voltage ramp on said capacitor comprises a mean slope.

14. The DC-DC converter of claim 12, wherein said stepwise voltage ramp generator further comprises a discharge switch coupled in parallel with said capacitor and configured to be controlled by a discharge signal.

15. The DC-DC converter of claim 12, wherein said stepwise voltage ramp generator is integrated on a semiconductor chip.

16. A method of making a stepwise voltage ramp generator comprising:
   coupling a capacitor to a supply line with at least one transistor;
   coupling a diode-connected transistor configured to be biased with a bias current to the at least one transistor to thereby form a current mirror;
   coupling a bypass switch in parallel with the diode-connected transistor and configured to be controlled by a pulse width modulation (PWM) timing signal; and
   coupling an adjustable delay circuit to a logic circuit for generating the PWM timing signal from a system clock signal so that a voltage ramp comprises a plurality of voltage steps is generated on said capacitor, and wherein each voltage step has a voltage increase during a clock pulse and a constant voltage until a next clock pulse.

17. The method of claim 16, wherein a slope of the voltage ramp on said capacitor comprises a mean slope.

18. The method of claim 16, further comprising coupling a discharge switch in parallel with the capacitor and configured to be controlled by a discharge signal.

19. The method of claim 16, wherein the capacitor, the supply line, the at least one transistor, the diode-connected transistor, and the bypass switch are integrated on a semiconductor chip.

20. The method of claim 19, wherein the diode-connected transistor and the at least one transistor comprise N-channel MOSFETs.

21. The method of claim 19, wherein the diode-connected transistor and the at least one transistor comprise P-channel MOSFETs.

22. The method of claim 19, wherein the logic circuit and the adjustable delay circuit are also integrated on the semiconductor chip.

* * * * *